(12) United States Patent
Flood

(10) Patent No.: US 6,501,340 B1
(45) Date of Patent: Dec. 31, 2002

(54) OSCILLATOR WITH FREQUENCY STABILIZING CIRCUIT AND METHOD OF CONSTRUCTING SAME

(75) Inventor: John F. Flood, Plantation, FL (US)

(73) Assignee: ACR Electronics, Inc., Fort Lauderdale, FL (US)

( * ) Notice: Subject to any disclaimer, the term of this patent is extended or adjusted under 35 U.S.C. 154(b) by 0 days.

(21) Appl. No.: 09/683,747

(22) Filed: Feb. 11, 2002

(51) Int. Cl.[7] .............................. H03B 5/04; H03B 5/36; H01L 41/04
(52) U.S. Cl. .......................... 331/69; 331/66; 331/158; 310/315; 310/318; 310/343
(58) Field of Search ............................... 331/66, 68–70, 331/116 R, 116 FE, 158, 175, 176, 108 B; 310/315, 318, 343

(56) References Cited

U.S. PATENT DOCUMENTS

| | | | | |
|---|---|---|---|---|
| 4,158,805 A | * | 6/1979 | Ballato | ........................ 324/56 |
| 6,362,700 B1 | * | 3/2002 | Fry | ............................. 331/176 |

* cited by examiner

*Primary Examiner*—David C. Mis
(74) *Attorney, Agent, or Firm*—Malin, Haley & DiMaggio, P.A.

(57) ABSTRACT

An apparatus and method for stabilizing the frequency of a piezoelectric crystal resonator, especially useful in common emergency positioning radio beacons. A temperature compensated crystal oscillator circuit (TCXO) is mounted on one surface of a thin substrate. The TCXO includes a piezoelectric device such as a quartz resonator and a capacitor thermistor compensation network to reduce the frequency fluctuations of the crystal through variations in temperature. A heating circuit is mounted to the opposing surface of the substrate, thereby providing a thermal connection between the two circuits. The heating circuit includes a temperature sensor for sensing changes in ambient temperatures and a heater control amplifier for adjusting the power of a heating element. The substrate with the two circuits disposed thereon is suspended within a hermetically sealed enclosure by a plurality of support pins. The pins assist in supporting the substrate away from the interior walls of the enclosure thereby reducing heat loss. The crystal oscillator is therefore maintained within a certain temperature range while temperatures at which activity dips often occur are avoided. The invention is also a method for constructing an electronic component heater assembly, including the construction of conventional oven controlled crystal oscillators.

25 Claims, 5 Drawing Sheets

Temperature Controlled (TCXO)

Oven Controlled (OCXO)

OSCILLATOR WITH FREQUENCY STABILIZING CIRCUIT AND METHOD OF CONSTRUCTING SAME

BACKGROUND OF INVENTION

1. Field of the Invention

The present invention relates to the field of crystal oscillators and specifically to a crystal oscillator frequency stabilizing apparatus that utilizes a hybrid Temperature Compensated Crystal Oscillator (TCXO) and Oven Controlled Crystal Oscillator (OCXO) design in order to maintain the temperature of the oscillator within a given predetermined operating range as well as avoiding temperatures at which activity dips frequently occur.

2. Description of Related Art

Crystal-controlled oscillators comprise a large portion of the frequency sources that are used in many RF signal-transmitting devices including emergency personnel locating devices. In emergency personnel location devices, it becomes critical to incorporate an oscillator frequency source that provides a predictable stable oscillation frequency through varying ambient temperatures.

Aircraft emergency locator systems such as ELTs (Emergency Locator Transmitters) and terrestrial location systems such as PLBs (Personal Locator Beacons) each require stable frequency sources. Individuals lost at sea and fortunate enough to have emergency location identification devices such as an Emergency Position Indicating Radio Beacon (EPIRB), can send out RF signals with the hopes that their distress signals will be picked up by maritime stations or satellites, which can in turn, relay the information to the proper authorities.

Distress signals are transmitted at very specific frequency ranges. For example, 406 MHz is a specific frequency that is only allowed for emergency broadcast for aviation and maritime radio communication channels such as "mayday" or "SOS"-related distress signals. Stable frequency sources are needed to support accurate beacon location. Satellites can locate the beacons by a Doppler measuring technique that gives the satellite a line of position when the satellite passes the beacon location. A major limitation on the accuracy of such Doppler locations is the frequency stability of the beacon transmitter. As an example, 406 MHZ signals which use the OCXO typically can be located to a position accuracy of 1 or 2 kilometers while signals at 121.5 MHz (another emergency broadcast frequency) which usually use unheated crystal oscillators can be located to a position accuracy of between 10 and 30 kilometers.

Many RF stable frequency sources incorporate electrical circuits that provide automatic frequency adjustment to compensate for temperature-driven frequency variations that commonly occur in quartz crystals. These frequency sources allow the crystal temperature to vary and then attempt to provide frequency correction by various tuning schemes, known in the art as Temperature Compensated Crystal Oscillators (TCXOs) and other closely related schemes such as Microprocessor Controlled Crystal Oscillators (MCXOs) and Digitally Compensated Crystal Oscillators (DCXOs).

Each of the above mentioned schemes share a common difficulty known as quartz crystal activity dips, which cause phase and frequency instability in the oscillator output, and in some severe cases, the circuit may cease oscillation entirely. These activity dips occur at discrete temperatures, which are usually unique to each crystal unit. The activity dips result from undesired modes of vibration within the crystal combined with the desired mode to either reinforce or interfere with desired mode resonance. The unique temperature behavior of each unit results from the desired mode and undesired modes having different temperature/frequency coefficients, and when the temperature is just right, the desired and undesired modes can have the same frequency and therefore interfere, causing large frequency resonance variations within the crystal.

Oven Controlled Crystal Oscillators (OCXOs) are stable frequency sources that incorporate oscillator circuits and crystal in a precisely temperature-controlled oven enclosure.

OCXOs are used where the ultimate in frequency stability is required. The degree of frequency stability achieved by an OCXO depends on the quality of the temperature control circuits, the design of the oven enclosure, arid most importantly, the match between the oven operating temperature and the zero temperature/frequency slope (turn-over) temperature of the crystal. However, accurate frequency control by OCXOs requires high power, large ovens, and very accurately processed and characterized crystals.

The present invention utilizes a TCXO in combination with an oven circuit thereby eliminating the need for exact control of the crystal cut to achieve a specific turn-over temperature and eliminating the requirement for precise setting and control of oven temperature matching the crystal turn-over temperature thereby allowing use of an inexpensive oven circuit and package.

Certain applications for frequency sources could be readily serviced by Temperature Compensated Crystal Oscillators (TCXOs) if the activity dip phenomenon could be eliminated. Unfortunately, there is presently no compensated scheme that is completely free of activity dips and the associated phase and frequency instability.

An additional problem with TCXOs is that TCXOs assume the local environmental temperature, typically between 40° C. to 50 or 60° C. At the temperature extreme, the rate of crystal frequency change with temperature change becomes excessive and impossible to accurately compensate.

The present invention incorporates an oven circuit that keeps the TCXO temperature away form activity dips that occur randomly over the oscillator temperature range thereby providing greatly improved frequency and phase stability compared to standard TCXO designs.

Additionally, although there have been attempts in the prior art to provide a hybrid TCXO-OCXO design where the heater element is used to keep the TCXO from going below a minimum temperature where it no longer functions, such as U.S. Pat. No. 6,060,692 issued to Bartley et al., such attempts fail to address the activity dip problem since the oven does not operate while the temperature is above the TCXO low temperature "critical" limit, and there is therefore no way to avoid activity dip temperatures that occur within the TCXO's normal operating temperature range.

Further, prior art OCXO components are mounted on standard, thick PCB or ceramic substrates and substrate mounted to the case by heavy metal leads to support the substrate structure. The heavy leads used for mechanical support conduct heat away from the substrate causing oven current demand to increase substantially.

Accordingly, what is needed in the art is a crystal oscillator frequency stabilizing apparatus that incorporates the beneficial features of TCXO and OCXO circuits in order to maintain the temperature of the oscillator within a given predetermined operating range as well as avoiding temperatures at which activity dips frequently occur and a method of constructing an oscillator circuit wherein the design of the substrate results in minimal heat loss through the substrate and surrounding components.

SUMMARY OF INVENTION

The present invention is a crystal oscillator frequency stabilizing apparatus and method of constructing same that combines an inexpensive TCXO design with a miniature, inexpensive, oven circuit design whereby the TCXO is kept in a small high temperature range just above the operating temperature range and away from activity dips of the TCXO crystal. The TCXO compensates for allowed temperature variation resulting from ambient temperature changes and small, low power, inexpensive ovens. The overall result is a frequency source that offers greater stability than the TCXO without the instability of activity dips. Finally, the present invention provides a method for constructing oscillators with a heating circuit providing minimal heat loss through the substrate material.

An improved stabilized frequency source comprising a substrate, preferably having a thickness between 0.008 and 0.015 inches, a temperature compensated crystal oscillator (TCXO) disposed upon a first surface of the substrate, a heating control circuit for maintaining the temperature of a TCXO within a predetermined temperature range and outside of activity dip temperature ranges, where the heating circuit is disposed upon the substrate's second surface, substrate supporting means for supporting the substrate, the temperature compensated oscillation circuit and the heating element within an enclosure, and an enclosure housing the substrate and the circuits disposed thereon wherein the substrate, temperature compensated crystal oscillator circuit and heating circuit are not in contact with any portion of the enclosure.

Unlike the prior art, which uses a piezoelectric crystal with precisely controlled turn-over temperature in conjunction with a precision oven, the present invention uses a TCXO replacing the piezo crystal, within a simple oven circuit. By using a TCXO, the need for tight tolerance crystal turn-over temperature control and tight tolerance oven temperature control is eliminated, by using an oven circuit to keep the TCXO within a small temperature range just above the maximum system operating temperature, frequency instability due to activity dips is eliminated while the cost is much less than a conventional OCXO.

In the preferred embodiment, the supporting means comprises a plurality of support pins protruding through corresponding apertures within the base of the enclosure and the substrate whereby the substrate, temperature compensated crystal oscillator circuit and heating circuit are suspended within the enclosure without making contact with any portion of the enclosure.

The temperature compensated crystal oscillator circuit is comprised of a piezoelectric crystal, an oscillator circuit and a thermistor temperature compensation network electrically coupled thereto. The heating circuit is comprised of a temperature sensor electrically coupled to a temperature control amplifier, and a heating element, such that upon certain ambient temperature variations, said temperature control amplifier receives a signal from the sensor and varies the heating element accordingly to maintain the substrate at approximately constant temperature.

Preferably, the temperature compensated crystal oscillator circuit and the heating circuit are each soldered on opposing surfaces of the thin substrate thereby providing a thermal but not an electrical connection between the circuits.

The enclosure is a standard resistance welded metal enclosure hermetically sealing the components within.

The present invention also provides a method of stabilizing the frequency of a crystal oscillator, comprising the steps of providing a substrate having a first surface and a second surface, disposing a crystal oscillator circuit upon the first substrate surface, disposing a heating circuit for maintaining the temperature of a crystal oscillator within a predetermined temperature range and outside of activity dip temperature ranges, upon the second substrate surface, providing substrate supporting means for supporting the substrate and circuits thereon within an enclosure, and housing the substrate and the circuits disposed thereon within an enclosure wherein the substrate, crystal oscillator circuit and heating circuit are not in contact with any portion of the enclosure.

The present invention is an apparatus, which incorporates an inexpensive temperature compensated oscillation circuit, with a miniature, inexpensive, low precision oven circuit. Each circuit is disposed upon opposite surfaces of a very thin insulated substrate, and the substrate suspended away from the interior of the enclosure that houses the apparatus. The design avoids activity dips that often occur at discrete temperatures.

It is an additional feature of the present invention to provide a simple design that allows for the construction of electronic component heating assemblies that can be made by using conventional PCB techniques and automated SMT assembly while providing the desired high thermal coupling between the TCXO and oven circuits while providing low heat loss through the PCB material to the mounting structure.

In the preferred embodiment, the circuit means of the radio beacon includes a frequency source stabilizing apparatus comprising: a substrate having a first surface and a second surface; a temperature compensated crystal oscillator circuit disposed upon the first substrate surface; a heating circuit for maintaining the temperature of a crystal oscillator within a predetermined temperature range and outside of activity dip temperature ranges, said heating circuit disposed upon the second substrate surface; substrate supporting means for supporting the substrate, the temperature compensated oscillation circuit and the heating element; and an enclosure housing the substrate and the circuits disposed on the substrate wherein the substrate, the temperature compensated crystal oscillator circuit and the heating circuit are not in contact with any portion of the enclosure.

It is an object of this invention to provide an apparatus and method that stabilizes the RF frequency of a piezoelectric quartz resonator in a simple and cost-effective manner.

It is another object of this invention to provide a method of constructing an electronic component heater assembly that provides a stable RF frequency source.

It is yet another object of the present invention to provide an emergency positioning radio beacon comprised of a frequency stabilizer apparatus that stabilizes the RF frequency of a piezoelectric quartz resonator in a simple and cost-effective manner.

It is to be understood that both the foregoing general description and the following detailed description are explanatory and are not restrictive of the invention as claimed. The accompanying drawings, which are incorporated in and constitute part of the specification, illustrate the preferred embodiment of the present invention and together with the general description, serve to explain principles of the present invention.

DETAILED DESCRIPTION

Figure 1:
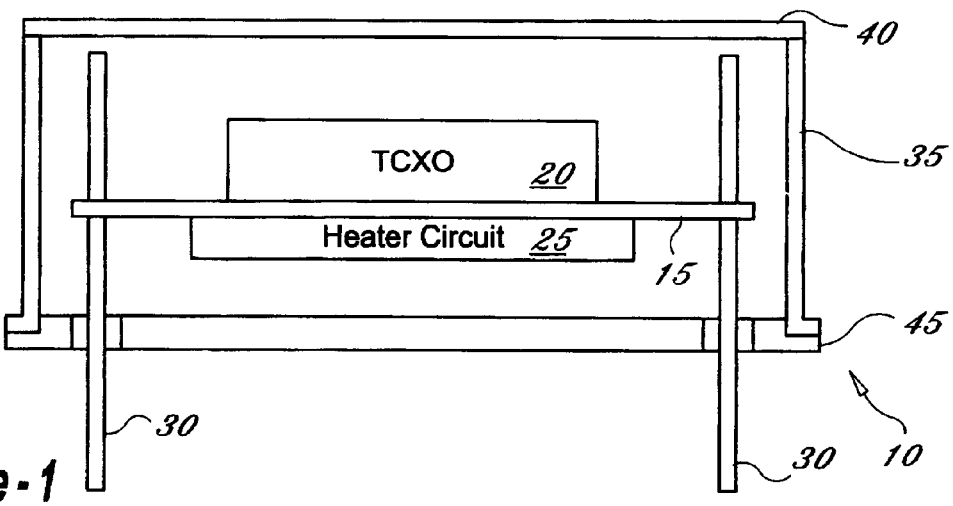
FIG. 1 is a cross sectional view of the improved RF frequency source of the present invention suspended within a sealed enclosure.

Referring now to the drawings, and more particularly to FIG. 1, the preferred embodiment of the present invention 10 is shown. The improved frequency source 10 includes a substrate 15, a temperature compensated crystal oscillator circuit (TCXO) 20, a heating circuit 25, four support pins 30 (two of which are shown), and a housing 35.

Substrate 15 is preferably a very thin, glass-reinforced electrical insulator, comprised of material of the type commonly used for multi-layered printed circuit boards, such as FR-4 or G-10 material. Alternatively, flex circuit material may be used. The substrate is preferably laminated with copper approximately 0.001 inches on each side and is between 0.008 and 0.015 inches thick. The relative thinness of substrate 15 and thermal reliefs provide minimal heat loss through the four support pins 30 which support substrate 15, TCXO 20 and heating circuit 25 thereby allowing for the temperature of the crystal circuit to be maintained with minimal power input.

TCXO 20 is a temperature compensated crystal oscillator circuit. TCXO 20 includes a piezoelectric device such as an AT or SC-cut quartz resonator. The TCXO of the present invention utilizes a thermistor/capacitor network electrically coupled to the quartz resonator that generates a tuning correction which is a function of the ambient temperature and which reduces the oscillator's frequency variations that occur over temperature ranges. A typical thermistor network employed by the present invention applies a tuning correction to the crystal circuit such that the crystal frequency varies by a small amount.

Activity dips are caused when undesired modes of vibration within the crystal are combined with the desired mode to either reinforce or interfere with desired mode resonance. The desired and undesired modes can have the same frequency and therefore interfere, causing large frequency resonance variations within the crystal.

Figure 4:
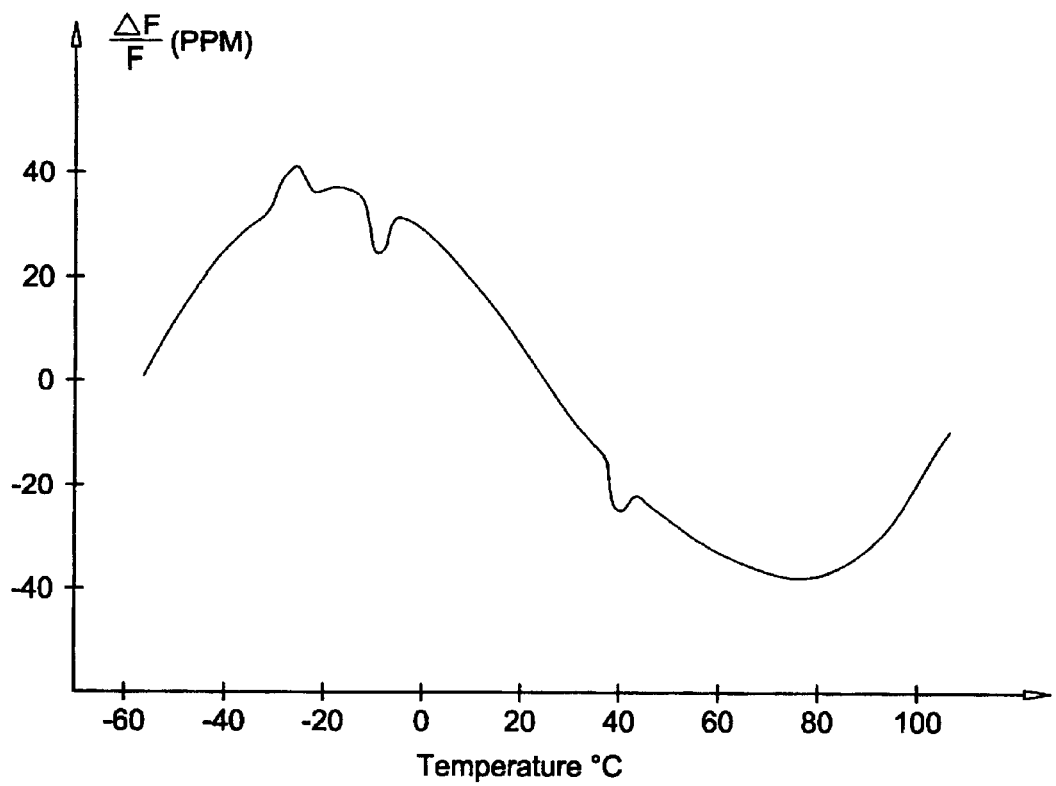
FIG. 4 illustrates frequency-temperature graphs showing the presence of activity dips at certain temperatures for a typical 10 MHz crystal.
Figure 4:
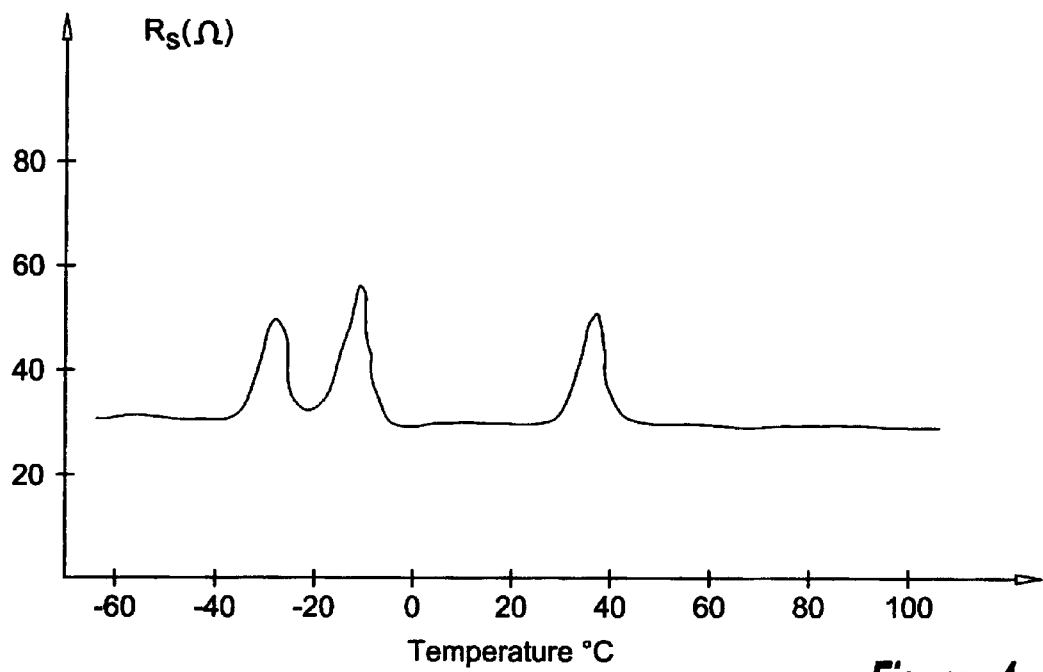
Figure 5:
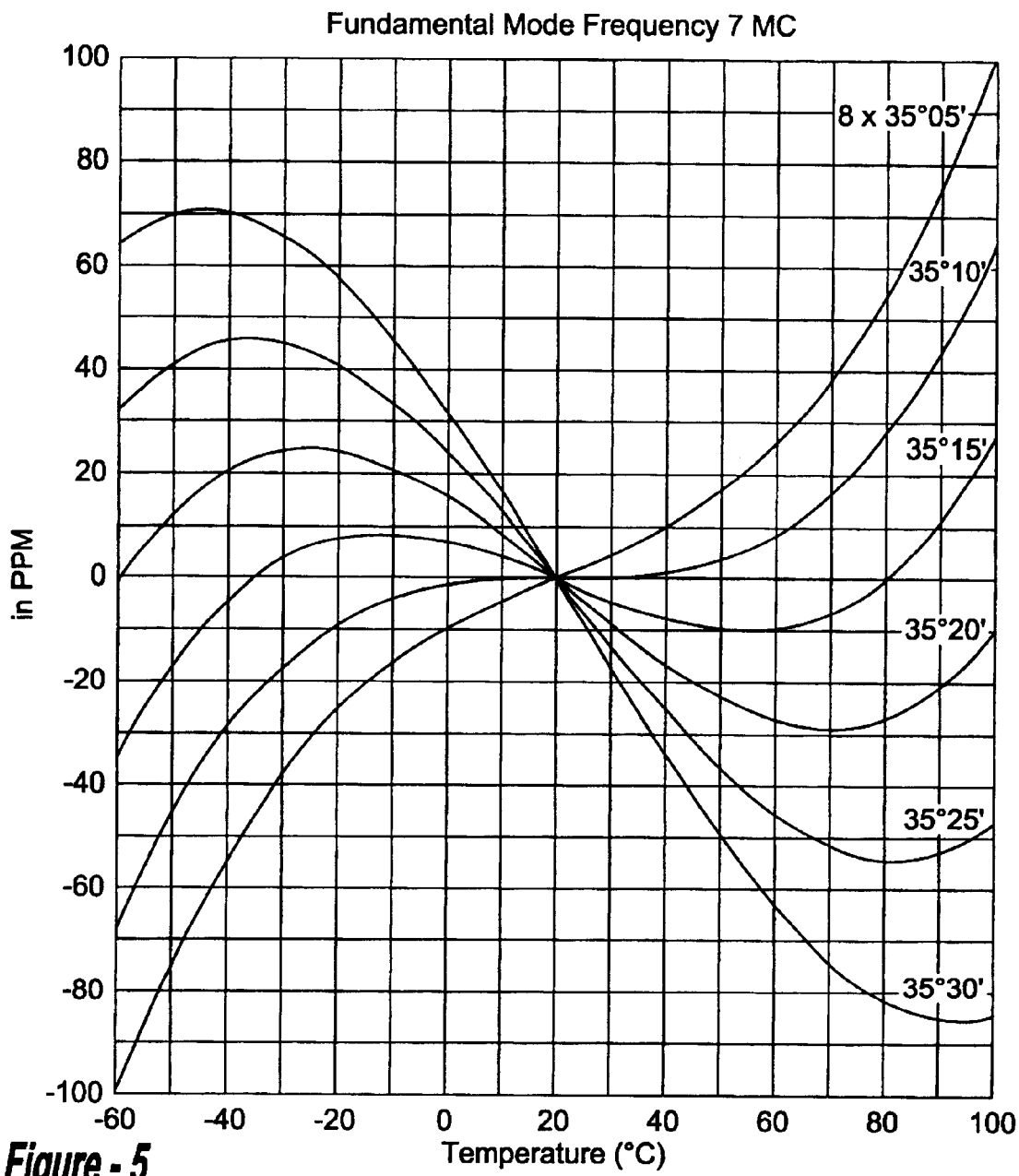
FIG. 5 is a frequency-temperature graph illustrating a typical crystal oscillator's frequency characteristics without a temperature compensating circuit.

FIG. 4 shows the presence of activity dips occurring at discrete temperatures for a typical 10 MHz piezoelectric crystal. Activity dips are severe changes in the frequency and severe increases in the resistance of the crystal. The present invention, by employing both a TCXO circuit and a heating element, each mounted to opposing sides of a substrate, operate to avoid the temperatures at which these activity dips occur.

Figure 6:
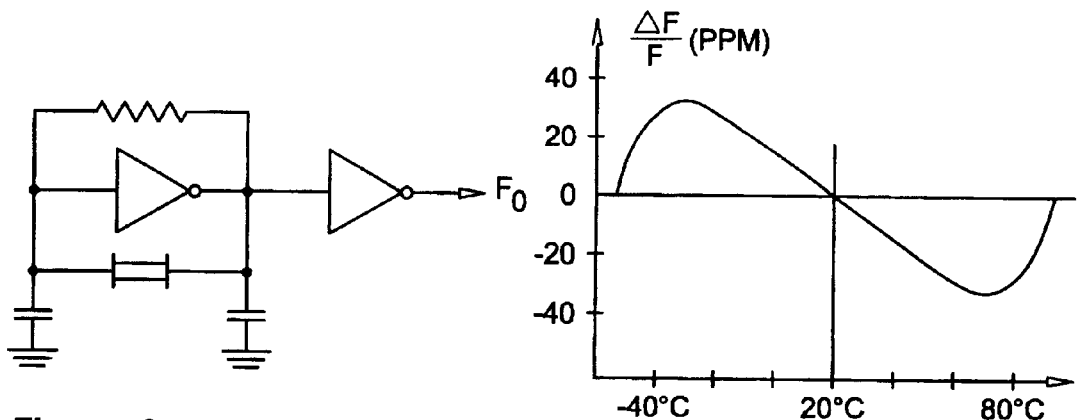
FIG. 6 is a schematic and a frequency-temperature graph illustrating a typical crystal oscillator circuit and the crystal oscillator's frequency characteristics without a temperature compensating circuit.

FIG. 6 shows a typical crystal oscillator and its frequency characteristics without the use of a temperature compensating circuit. As shown, the oscillator experiences a very wide range of frequency fluctuations over a given temperature range.

Figure 7:
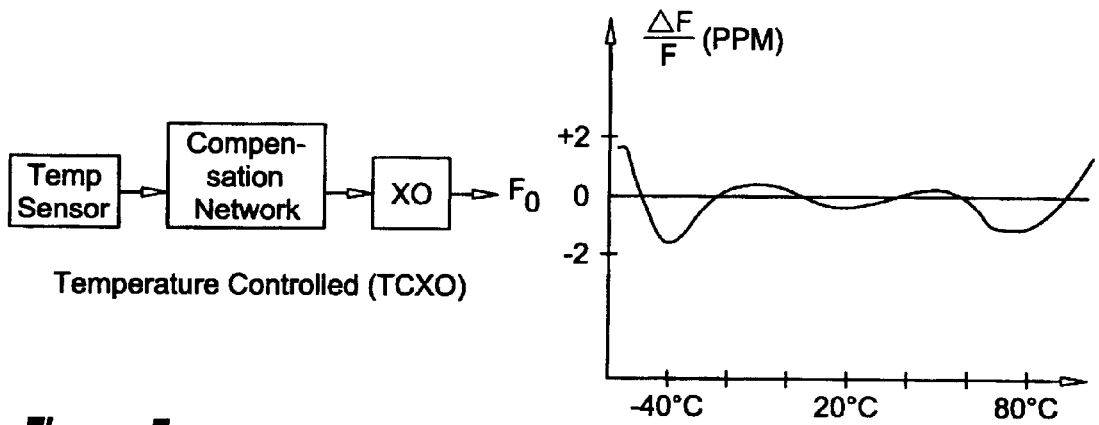
FIG. 7 is block diagram and a frequency-temperature graph illustrating a typical temperature compensated crystal oscillator circuit and the effects of a temperature compensated crystal oscillator circuit upon the frequency-temperature characteristics of a crystal oscillator.

FIG. 7 illustrates a typical TCXO circuit (in block diagram form) commonly used in the art. Here, it can be seen that the frequency fluctuations ($\Delta f/f$) over a temperature range are significantly less (approximately on the order of $\pm 2$ ppm between $-40°$ C. to $80°$ C.) when a TCXO is employed. If the compensation network shown in FIG. 7 involves digital or digital/analog circuits, then the unit is generally referred to as a DCXO or a MCXO. However, even with oscillator frequency compensation, at certain temperatures, the amplitude of oscillation, or activity, decreases abruptly or even drops to zero at certain discrete temperatures. These activity dips can cause partial or complete failure of the oscillator.

Figure 8:
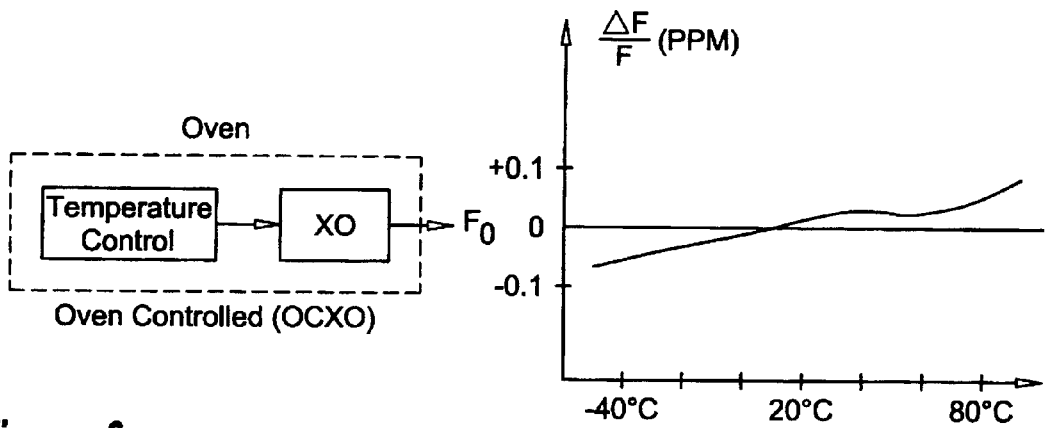
FIG. 8 is block diagram and a frequency-temperature graph illustrating a typical oven controlled crystal oscillator circuit and the effects of an oven controlled crystal oscillator circuit upon the frequency-temperature characteristics of a crystal oscillator.

FIG. 8 shows an Oven Controlled Crystal Oscillator (OCXO) circuit of the type commonly used in the art. Although oven controlled crystal oscillators are effective at reducing frequency variations over temperature fluctuations, they are prohibitively expensive.

In the present invention, TCXO 20 is disposed upon one surface of substrate 15. The preferred technique is to solder the TCXO upon the surface of substrate 15, a process known in the art as Surface Mount Technology (SMT). As with the TCXO, the preferred method of affixing the heating circuit 25 on the substrate is to solder the heating IC chip(s) on substrate 15 (SMT). Other common methods of adhering integrated circuits on a thin substrate can be employed.

FIG. 1 shows TCXO 20 on the top surface of substrate 15 and the heating circuit 25 upon the bottom surface of substrate 15. The present invention can function as effectively if each circuit were disposed upon the opposite side of substrate 15. What is critical to the invention is that TCXO 20 and heating circuit 25 are disposed upon opposite sides of substrate 15. In this fashion, the TCXO and the heating circuit are thermally but not electrically connected.

Heating circuit 25 utilizes the same technique as an Oven Controlled Crystal Oscillator (OCXO) in that the temperature sensitive components of the oscillator are maintained at a constant temperature by use of a temperature sensor which applies a steady heat flow to the resonator which changes with the ambient temperature thereby maintaining a fixed oven temperature. A good OCXO may have a frequency vs. temperature stability of better than $\pm 5 \times 10^{-9}$ for a temperature range of $-55°$ C. to $85°$ C.

What distinguishes the present invention from other types of oscillator frequency stabilizer designs commonly employed in the prior art is the use of both a TCXO and a heater circuit. Not only does the present invention employ this hybrid approach, but also provides for the thermal connectivity of each circuit via each circuit's relationship with the substrate and the suspension of the substrate within a hermetically-sealed enclosure. While a TCXO provides a temperature-compensation circuit that essentially removes most of the frequency fluctuations caused by variations in temperature, a TXCO does not effectively address the problem heretofore described, i.e. activity dips.

The present invention utilizes a closed loop temperature control feedback circuit to maintain the temperature of the resonator within a predetermined range thus minimizing oscillator frequency fluctuations, and avoiding activity dip temperatures, specific to the crystal oscillator being used.

Figure 2:
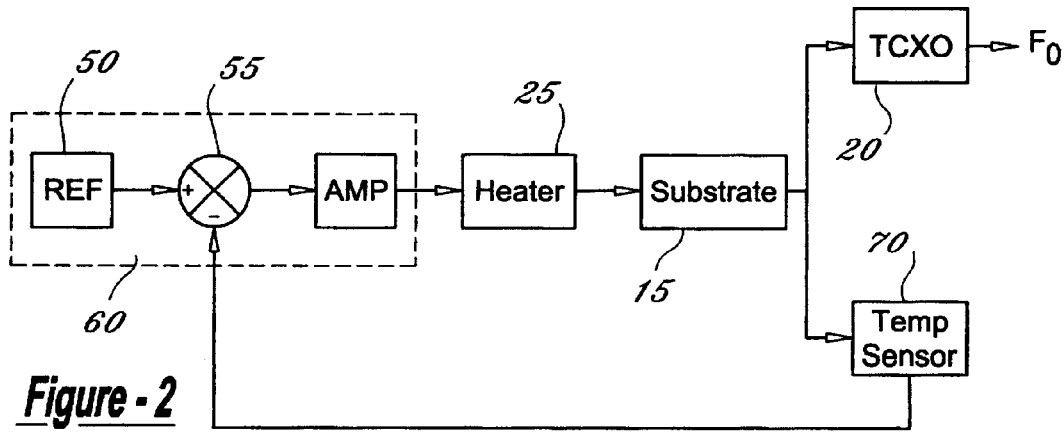
FIG. 2 is a block diagram illustrating the relationship of the components of the preferred embodiment of the present invention.
Figure 3:
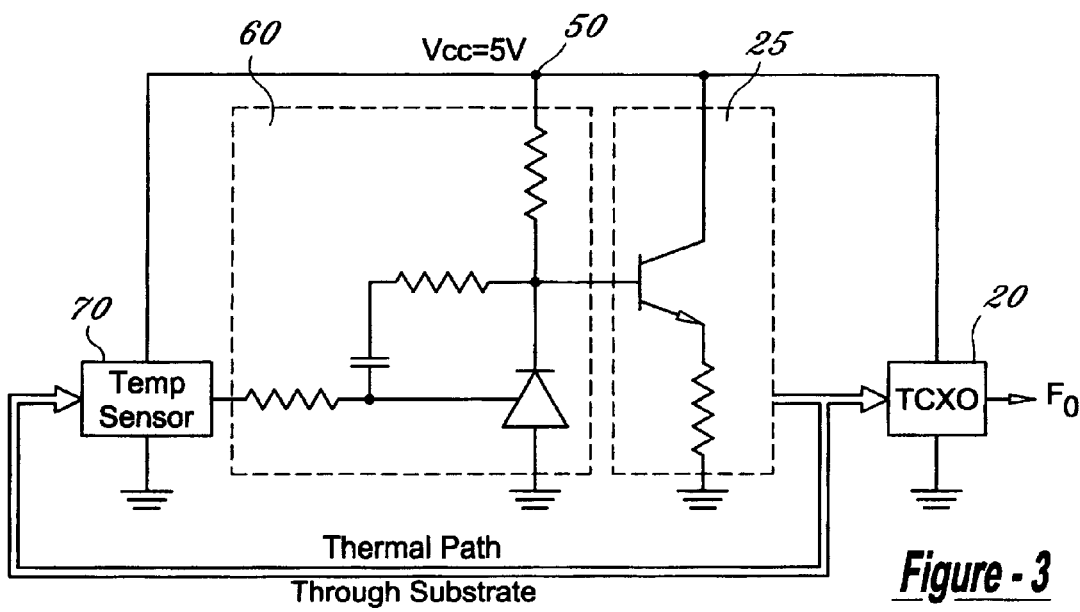
FIG. 3 is a schematic diagram illustrating the relationship of the components of the preferred embodiment of the present invention.

Referring once again to FIG. 1, it can be seen that the TCXO-substrate-Heating circuit combination is suspended within enclosure 35, by a plurality of support pins 30. Enclosure 35 is a resistance welded metal enclosure. Preferably, four pins 30 extend substantially vertically through four corresponding apertures, one in each corner of substrate 15. The top of the pins are encased within lid 40 and extend through hermetic sealed apertures in base 45. Pins 30 extend through the bottom of enclosure 35. The substrate 15 and the components soldered on each of its surfaces, do not contact any portion of the enclosure. They are suspended within the enclosure by one or more pins 30. The suspension of the substrate away from any contact with enclosure 35 minimizes heat loss through the walls or base of the enclosure. Referring now to FIGS. 2 and 3, a block diagram and a corresponding circuit schematic, respectively, are shown illustrating the major components of the present invention. A reference voltage 50 is applied to the system. A temperature sensor 70 determines if the substrate temperature is above or below a certain predetermined value and if so, applies an offset voltage 55 to an amplifier circuit 60 which then varies the power to the heating circuit 25. The TCXO 20 includes the piezoelectric element and a thermistor network, which also reduces the frequency variations of the piezoelectric element due to temperature variations. TCXO 20, heating circuit 25 and sensor 70 are all mounted within enclosure 35.

Figure 9:
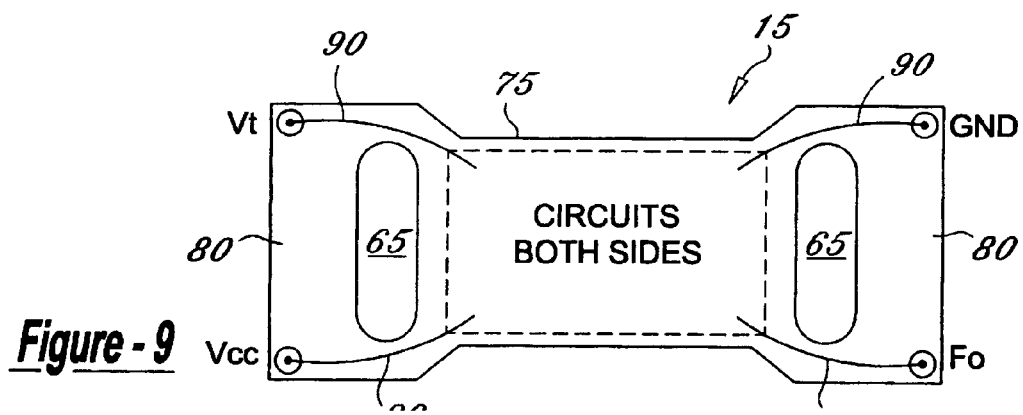
FIG. 9 is a top down view of the substrate used in the present invention.

Referring now to FIG. 9, a top view of substrate 15 can be seen. One of the features of the present invention is an improved method of constructing a stable frequency source. As can be seen in FIG. 9, substrate 15 is substantially rectangular in shape with a narrow center section 75 and two wider wing sections 80. By reducing the amount of material area in the center portion of substrate 15, less heat loss occurs by gas conduction and convection from the substrate. Further, additional, unused substrate material may be removed as shown by the two slots 65 on each wing portion 80. Etched thin leads 90 approximately 0.005 inches wide and 0.0005 inches thick electrically couple the TCXO circuit 20 and heater circuit 25, each disposed on one side of substrate 15, to voltage, ground and other external circuits. Substrate 15 is preferably a glass reinforced thin substrate, further minimizing heat loss.

The substrate design shown in FIG. 9 need not be limited to TCXO/Oven hybrid oscillator designs, but may be used in ordinary OCXOs. The slots 65 and contoured shape of substrate 15 define narrow connecting arms, which provide mechanical support and printed circuit I/O electrical connections for each circuit. The thin leads provide good electrical connection while minimizing thermal loss from the circuit's I/O pins. Finally, the thin glass reinforced substrate 15 provides rugged mechanical support for the circuits and a low impedance thermal path between the circuits on opposite sides of substrate 15, while minimizing heat loss from the circuits to the I/O pins. To further minimize heat loss through the substrate, supporting pins and enclosure, the enclosure is preferably filled with low thermal conductivity gas or a vacuum.

Figure 10:
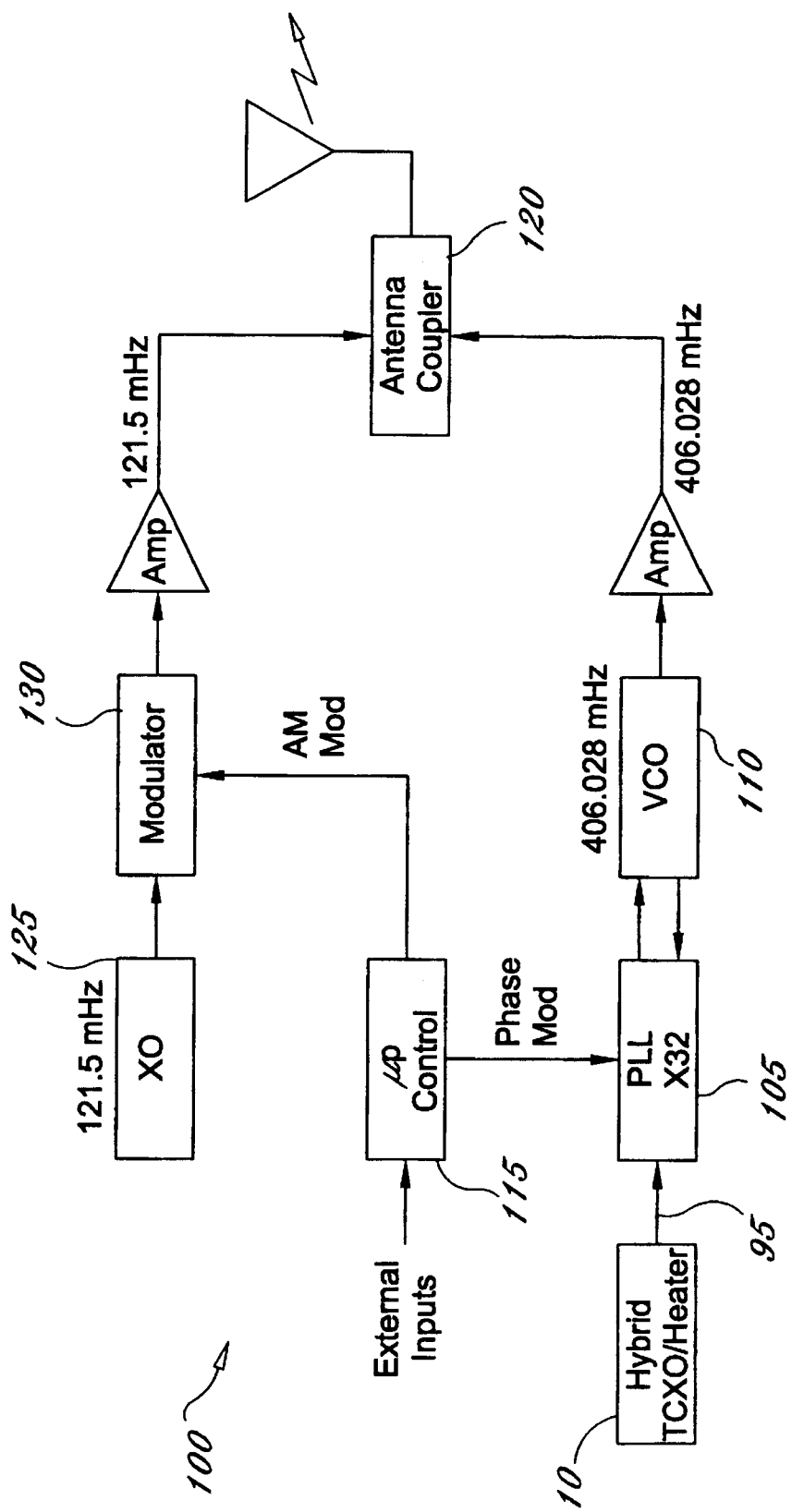
FIG. 10 is a block diagram of a typical radio beacon apparatus incorporating the frequency stabilizing apparatus of the present invention.

Practically, the frequency stabilizing apparatus 10 of the present invention can be incorporated into a typical radio beacon device in order to stabilize the frequency of the resultant RF signal. Referring now to FIG. 10, a block diagram of a typical radio beacon 100, such as an ELT, PLB or EPIRB, incorporating the frequency stabilizing apparatus 10 of the present invention, is shown. Apparatus 10 provides a frequency-stabilized input signal 95 to a Phase-Locked loop (PLL) 105 and Voltage Control Oscillator (VCO) 110 feedback circuit. Microprocessor 115 provides control and phase modulation in order to produce a 406.028 MHz signal to the Antenna Coupler 120. Crystal Oscillator (XO) 125 generates a 121.5 MHz signal which is AM modulated by Modulator Circuit 130 to produce the signal to Antenna Coupler 120. Frequency stabilizing apparatus 10 maintains the signal at a steady frequency during the course of temperature variations. Activity dips that often occur at discrete temperatures are avoided.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A frequency source stabilizing apparatus comprising:
   a temperature compensated frequency source; and
   means for heating said temperature compensated frequency source in order to maintain the temperature of said temperature compensated frequency source within a predetermined temperature range and outside of activity dip temperature ranges.

2. A frequency source stabilizing apparatus comprising:
   a substrate having a first surface and a second surface;
   a temperature compensated crystal oscillator circuit disposed upon said first substrate surface;
   a heating circuit for maintaining the temperature of a crystal oscillator within a predetermined temperature range and outside of activity dip temperature ranges, said heating circuit disposed upon said second substrate surface;
   substrate supporting means for supporting said substrate, said temperature compensated oscillation circuit and said heating element; and
   an enclosure housing said substrate and said circuits disposed thereon wherein said substrate, said temperature compensated crystal oscillator circuit and said heating circuit are not in contact with any portion of said enclosure.

3. The frequency source stabilizing apparatus of claim 2 wherein said substrate supporting means comprises a plurality of support pins protruding through corresponding apertures within said enclosure and said substrate whereby said substrate, said temperature compensated crystal oscillator circuit and said heating circuit are suspended within said enclosure so as to avoid contact with any portion of said enclosure.

4. The frequency source stabilizing apparatus of claim 2 wherein said temperature compensated crystal oscillator circuit is comprised of a piezoelectric crystal and amplifier and a thermistor temperature compensation network electrically coupled thereto.

5. The frequency source stabilizing apparatus of claim 2 wherein said heating circuit is comprised of a temperature sensor electrically coupled to a temperature control amplifier, and a heating element, such that upon certain ambient temperature variations, said temperature control amplifier receives a feedback signal from said sensor and varies said heating element accordingly.

6. The frequency source stabilizing apparatus of claim 2 wherein said temperature compensated crystal oscillator circuit and said heating circuit are each mounted on opposing surfaces of said substrate thereby providing a thermal but not an electrical connection between said circuits.

7. The frequency source stabilizing apparatus of claim 2 wherein said enclosure is a hermetically sealed chamber.

8. The frequency source stabilizing apparatus of claim 2 wherein said substrate has a thickness of between 0.008 and 0.015 inches.

9. A method of stabilizing the frequency of a crystal oscillator, comprising the steps of:
  providing a substrate having a first surface and a second surface;
  disposing upon said first substrate surface, a temperature compensated crystal oscillator circuit;
  disposing upon said second substrate surface, a heating circuit for maintaining a temperature of a crystal oscillator within a predetermined temperature range and outside of activity dip temperature ranges;
  providing substrate supporting means for supporting said substrate, said temperature compensated crystal oscillation circuit and said heating element; and
  housing said substrate and said circuits disposed thereon within an enclosure wherein said substrate, said temperature compensated crystal oscillator circuit and said heating circuit are not in contact with any portion of said enclosure.

10. A method of constructing an electronic component heater assembly comprising the steps of:
  providing a thin substrate having a first surface and a second surface; disposing upon said first substrate surface, a temperature compensated crystal oscillator circuit; and disposing upon said second substrate surface, a heating circuit for maintaining the temperature of a crystal oscillator within a predetermined temperature range and outside of activity dip temperature ranges.

11. The method of claim 10 wherein said substrate includes one or more slots disposed therein thereby reducing unused substrate surface in order to minimize heat loss from said substrate.

12. The method of claim 10 further comprising the step of providing substrate supporting means for supporting said substrate, said temperature compensated oscillation circuit and said heating element.

13. The method of claim 12 wherein said substrate supporting means includes a plurality of thin lead traces which provide electrical input/output connections while minimizing heat loss from said circuits to said supporting means.

14. The method of claim 10 wherein said substrate defines a contoured perimeter edge wherein said substrate perimeter defines a narrow central portion upon which are disposed said heating circuit and said temperature compensated crystal oscillator circuit and a pair of wider outer sections upon which are disposed electrical connections to said heating circuit and said temperature compensated crystal oscillator circuit.

15. The method of claim 10 further comprising the step of housing said substrate and said circuits disposed thereon within an enclosure wherein said substrate, said temperature compensated crystal oscillator circuit and said heating circuit are not in contact with any portion of said enclosure.

16. The method of claim 15 wherein said enclosure is hermetically sealed.

17. The method of claim 16 wherein said enclosure is filled with gas.

18. The method of claim 17 wherein said gas is Xenon.

19. The method of claim 10 wherein said substrate is made of a glass reinforced material.

20. The method of claim 10 wherein said substrate is flexible.

21. The method of claim 10 wherein said substrate is rigid.

22. The method of claim 10 wherein said substrate has a thickness of between 0.008 and 0.015 inches.

23. A method of constructing a conventional oven controlled circuit oscillator comprising the steps of:
  providing a thin substrate having a first surface and a second surface; disposing a crystal oscillator upon said first substrate surface; and disposing upon said second substrate surface, a heating circuit for maintaining the temperature of said crystal oscillator within a predetermined temperature range and outside of activity dip temperature ranges.

24. An emergency position indicating radio beacon comprising: an electrical power supply; circuit means for generating radio frequency signals for broadcast; said circuit means including a temperature compensated frequency source and heating means for maintaining a temperature of said frequency source within a predetermined temperature range and outside of activity dip temperature ranges; an enclosure for housing said circuit means and said electrical power supply; and an antenna connected to said housing and electrically coupled to said circuit means for transmitting said radio frequency signals.

25. The emergency position indicating radio beacon of claim 24 wherein said circuit means includes a frequency source stabilizing apparatus comprising: a substrate having a first surface and a second surface; a temperature compensated crystal oscillator circuit disposed upon said first substrate surface; a heating circuit for maintaining the temperature of a crystal oscillator within a predetermined temperature range and outside of activity dip temperature ranges, said heating circuit disposed upon said second substrate surface; substrate supporting means for supporting said substrate, said temperature compensated oscillation circuit and said heating element; and an enclosure housing said substrate and said circuits disposed thereon wherein said substrate, said temperature compensated crystal oscillator circuit and said heating circuit are not in contact with any portion of said enclosure.

* * * * *